United States Patent
Ramakrishnan et al.

(10) Patent No.: US 9,160,358 B2
(45) Date of Patent: Oct. 13, 2015

(54) CLOSE-IN TONES

(71) Applicant: TEXAS INSTRUMENTS INCORPORATED, Dallas, TX (US)

(72) Inventors: Sthanunathan Ramakrishnan, Karnataka (IN); Jawaharlal Tangudu, Karnataka (IN); Sashidharan Venkatraman, Karnataka (IN); Karthik Khanna Subramani, Tamilnadu (IN); Sreenath Narayanan Potty, Kerala (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/656,025

(22) Filed: Mar. 12, 2015

(65) Prior Publication Data
US 2015/0263747 A1 Sep. 17, 2015

(51) Int. Cl.
*H03M 1/06* (2006.01)
*H03M 1/10* (2006.01)
*H03M 1/12* (2006.01)

(52) U.S. Cl.
CPC .............. *H03M 1/1085* (2013.01); *H03M 1/12* (2013.01)

(58) Field of Classification Search
CPC ... H03M 1/1085; H03M 1/12; H03M 1/1205; H03M 1/121; H03M 1/06; H03M 1/0602; H03M 1/0607

USPC .......................................... 341/118, 120, 155
See application file for complete search history.

(56) References Cited

U.S. PATENT DOCUMENTS

| | | | |
|---|---|---|---|
| 7,049,984 B2 * | 5/2006 | Wood et al. .................... | 341/120 |
| 7,084,793 B2 * | 8/2006 | Elbornsson .................... | 341/118 |
| 7,253,762 B2 * | 8/2007 | Huang et al. .................. | 341/155 |
| 7,283,074 B2 * | 10/2007 | Sheng et al. .................. | 341/120 |
| 7,916,051 B1 | 3/2011 | Sestok et al. | |
| 8,159,377 B2 * | 4/2012 | Goldman et al. ............. | 341/118 |
| 8,659,454 B2 * | 2/2014 | Sugimoto et al. ............. | 341/118 |
| 8,836,550 B2 * | 9/2014 | Snelgrove ...................... | 341/118 |
| 8,890,728 B2 * | 11/2014 | Le Dortz et al. .............. | 341/118 |

OTHER PUBLICATIONS

Behzad Razavi, "Problem of Timing Mismatch in Interleaved ADCs", Publisher IEEE, Sep. 2012, pp. 1-8.

* cited by examiner

*Primary Examiner* — Khai M Nguyen
(74) *Attorney, Agent, or Firm* — Alan A. R. Cooper; Frank D. Cimino

(57) ABSTRACT

A system can include a close-in tone control configured to detect a set of close-in tones of an interleaved analog to digital converter (IADC) signal and output a trigger signal in response to the detection. The system can also include a close-in tone mismatch estimator configured to determine a correlation and a power estimate for the set of close-in tones in the IADC signal in response to the trigger signal.

20 Claims, 9 Drawing Sheets

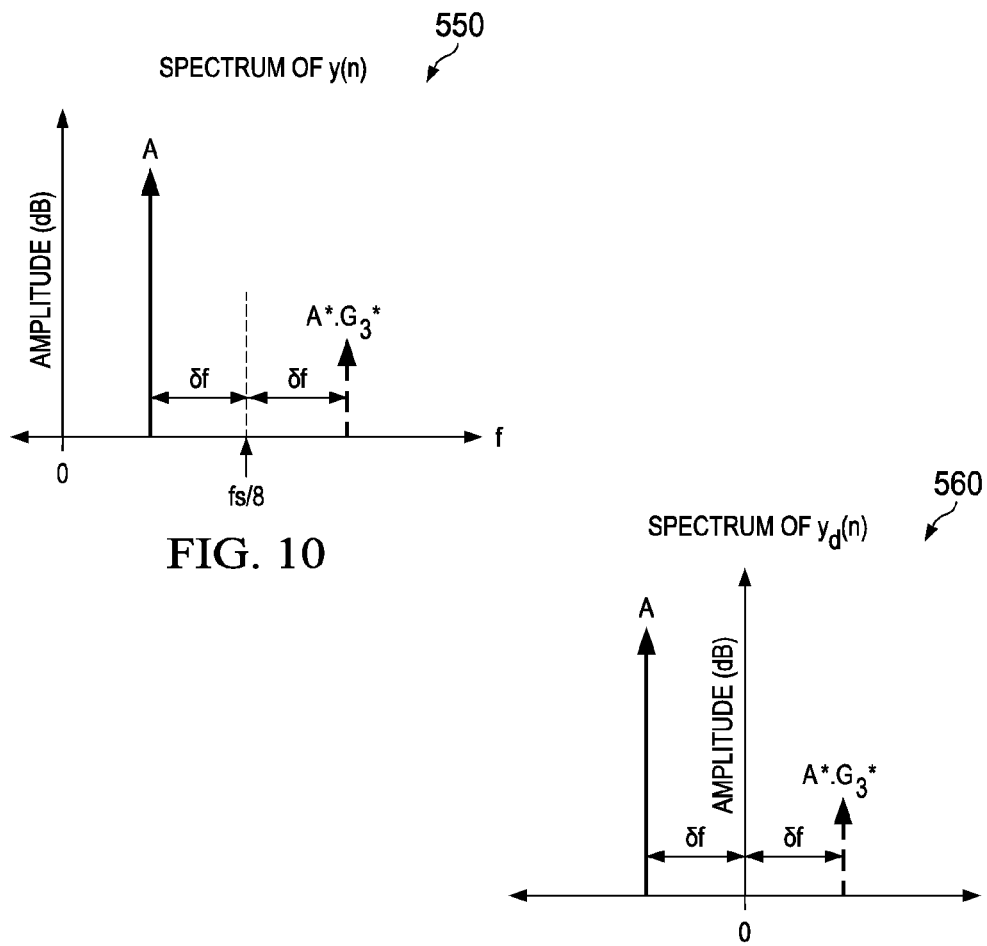
FIG. 10
FIG. 11
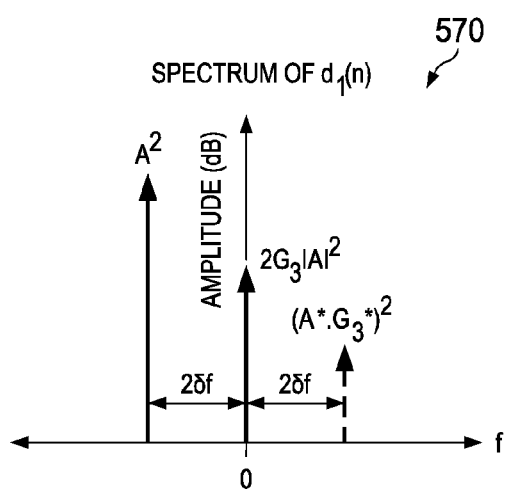
FIG. 12

CLOSE-IN TONES

CROSS REFERENCE TO RELATED APPLICATIONS

This application claims the benefit of priority to the Indian (IN) Patent Application entitled: "NOVEL TIME DOMAIN CORRECTOR IN THE PRESENCE OF INTERFERENCE IN AN INTERLEAVED ADC", Application No.: 1310/CHE/2014, filed on 12 Mar. 2014, which is incorporated herein by reference. Additionally, this application is related to the following commonly assigned co-pending U.S. patent applications entitled: "MISMATCH PROFILE", Ser. No. 14/656,205 and "MISMATCH CORRECTOR", Ser. No. 14/656,122; all of which are filed contemporaneously herewith and are incorporated herein by reference.

TECHNICAL FIELD

This disclosure relates to systems and methods for detecting close-in tones. More particularly, this disclosure relates to systems and methods for detecting close-in tones of an interleaved analog-to-digital converter signal. Additionally or alternatively, this disclosure relates to preventing an impact of interferers on mismatch profile estimation.

BACKGROUND

An analog-to-digital converter (ADC, A/D, or A to D) is a device that converts a continuous physical quantity (e.g., voltage) into a digital number that represents the quantity's amplitude. The analog-to-digital conversion involves quantization of the input, such that a small amount of error is introduced. Moreover, instead of doing a single conversion, an ADC often performs the conversions ("samples" the input) periodically. The result is a sequence of digital values that have been converted from a continuous-time and continuous-amplitude analog signal to a discrete-time and discrete-amplitude digital signal.

A time-interleaved ADC uses N parallel ADCs where each ADC samples data every Nth cycle of the effective sample clock, where N is a positive integer greater than one. The result is that the sample rate is increased N times compared to what each individual ADC can manage.

SUMMARY

Systems and methods for detecting close-in tones. Additionally or alternatively, systems and methods are described for preventing an impact of interferers on mismatch profile estimation.

One example relates to a system that can include a close-in tone control configured to detect a set of close-in tones of an interleaved analog to digital converter (IADC) signal and output a trigger signal in response to the detection. The system can also include a close-in tone mismatch estimator configured to determine a correlation and a power estimate for the set of close-in tones in the IADC signal in response to the trigger signal.

Another example relates to an integrated circuit (IC) chip. The IC chip can include an analog-to-digital converter (ADC) interleaver includes a plurality of ADCs that are each configured to sample an analog signal in response to a clock pulse. The interleaved ADC outputs an IADC signal that includes a plurality of spurs formed from mismatches between the plurality of ADCs. The IC chip can also include a frequency domain processor that determines a frequency domain representation of the interleaved IADC signal. The IC chip can further include a close-in tone control configured to detect a set of close-in tones of the IADC signal based on the frequency domain representation of the IADC signal. The close-in tone control can also be configured to receive data from a mismatch profile estimator characterizing an estimate of a mismatch profile for a tone near in frequency the set of close-in tones. The close-in tone control can still further be configured to output a trigger signal in response to detecting that an Fast Fourier Transform (FFT) bin corresponding to the set of close-in tones has a power above a power threshold and in response to determining that the estimate of the mismatch profile for the tones near in frequency the set of close-in tones has an uncertainty above an uncertainty threshold. The IC chip can further include a close-in tone mismatch estimator determines a correlation and a power estimate for the set of close-in tones in the IADC signal in response to the trigger signal.

Yet another example relates to a method that includes randomizing selection of blocks of samples an interleaved analog-to-digital (IADC) signal to provide randomly selected blocks. The method also includes applying a windowing function to the randomly selected blocks of samples of the IADC signal. The method further includes applying an FFT to the selected blocks of samples to determine a frequency domain representation of the IADC signal. The method yet further includes estimating a frequency domain mismatch for the interleaved ADC signal.

BRIEF DESCRIPTION OF THE DRAWINGS

FIGS. 10-13 depict graphs that illustrate the operations of a close-in tone mismatch estimator.

DETAILED DESCRIPTION

Figure 1:
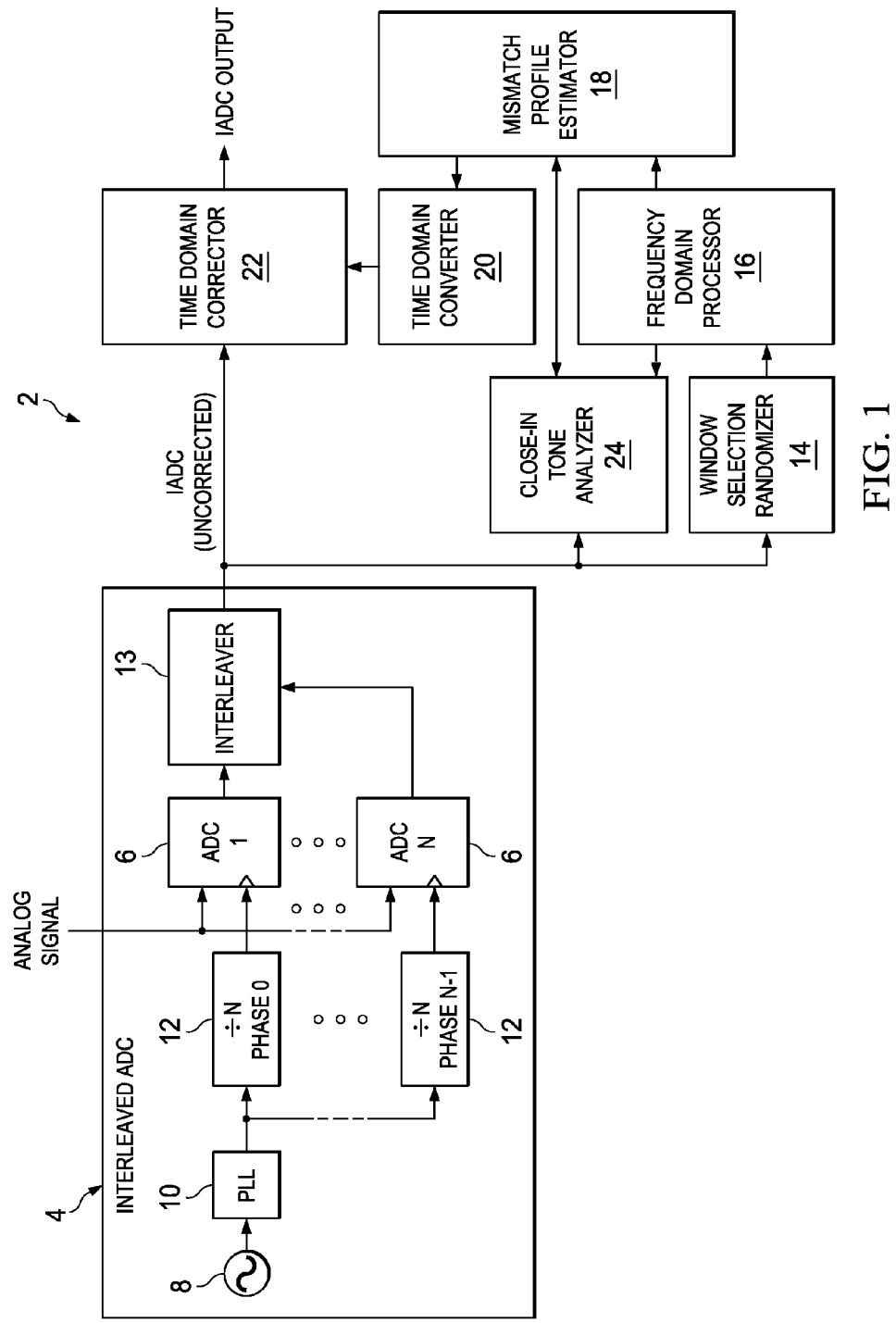
FIG. 1 illustrates an example of a system for determining a mismatch profile of an interleaved analog-to-digital converter (ADC).

Systems and methods are described for determining a correlation and a power estimate for close-in tones in output of an interleaved analog-to-digital converter (IADC). In general, for an IADC with M number of ADCs (where M is an integer greater than one), there are M−1 spurs. As used herein, the term "spur" denotes a spurious tone that interferes with the output of the interleaved ADC. Throughout this disclosure, these spurs are referred to as "images" of tones (or interleaving images), since the images of the tones are correlated to the tones in the manner described herein. As used herein, the term "close-in tones" denotes a situation where an interleaving image of a signal falls near (in terms of frequency) the signal itself.

The systems and methods described herein can address problems related to multiple situations where near (in terms of frequency) the image of a given tone (and/or other types of signal), an interfering tone exists. The interfering tone can be the given tone itself, which can be referred to as a close-in signal image case or a close-in tones case. In other situations, the interfering tone can be another tone, independent from the given tone, which can be referred to as the independent interferer case.

For purposes of simplification of explanation, throughout this disclosure an example is employed where there are 4 ADCs. In this situation, for an input tone at a frequency of $f_0$ and an amplitude of $A_0$, an output of the interleaved ADC can have three spurs occur due to the mismatches. In such a situation, the spurs can occur at $f_0 + f_s/4$ ($f_s$ is the sampling frequency of the interleaved ADC), $f_0 + 2f_s/4$ and $f_0 + 3f_s/4$, with respective complex amplitudes of $G_1(f_0)A_0$, $G_2(f_0)A_0$ and $G_3(f_0)A_0$. Based on this information, the systems and methods described herein can estimate the three components $G_1(f)$, $G_2(f)$ and $G_3(f)$ for frequencies across a band. The three components can be converted into filter coefficients that can be employed in correction filters to remove the mismatches in the output of the interleaved ADC. Accordingly, the systems and methods described herein can reduce/eliminate mismatches from an interleaved ADC signal.

As noted, in certain situations, such as the close-in tone case, a tone can fall very close/near (in terms of frequency) to an image of the tone. For example, for a tone close to $f_s/8$, $f_s/4$ or $3f_s/4$ an image of the tone can fall very close to the tone itself. In this case, the tone and the image of the tone can be referred to as a set of close-in tones. The systems and methods described can determine the correlation and the power estimate for the set of close-in tones in the time domain, thereby avoiding problems for processing such close-in tones, such as window leakage, that would occur in the frequency domain. This correlation and the power estimate can be employed to determine the mismatch profile estimate for the interleaved ADC signal for the close-in tones.

Additionally, in situations such as the independent interferer case, a window selection randomizer can introduce randomness into a block-selection process of a frequency domain conversion to ensure that the start of each block is randomly selected so as to provide randomly selected blocks of the interleaved ADC signal. Such randomness can avoid occurrences of poor estimation of mismatch profile in the independent interferer case.

FIG. 1 illustrates a block diagram of a system 2 for estimating mismatches in an interleaved ADC 4, which in some examples can be referred to as an ADC interleaver. The system 2 can be implemented, for example, as a circuit, such as an integrated circuit (IC) chip. For instance, the system 2 could be implemented as an Application Specific Integrated Circuit (ASIC) chip. In some examples, portions of the system 2 can be implemented as firmware accessible by a microcontroller. Additionally or alternatively, some of the blocks illustrated can be implemented as logic implemented on a field programmable gate array (FPGA) or a combination of logic and firmware. Moreover, although each block of the system 2 is shown and described as performing specific functions, it is to be understood that in other examples, the operations of each block can be performed by other blocks and/or in cooperation with multiple blocks.

The interleaved ADC 4 can include an array of N number of ADCs 6 that can sample an analog signal (labeled in FIG. 1 as "ANALOG SIGNAL"). The interleaved ADC 4 can be a time-interleaved ADC. A sample clock causes each of the N number of ADCs 6 to sample the analog signal. Thus, at each Nth sample, a given ADC 6 samples the analog signal. Output from each of the N number of ADCs 6 is interleaved (e.g., multiplexed) and output as an interleaved ADC ("IADC") signal, wherein N is an integer greater than one.

In FIG. 1, a clock signal 8 can be provided to a phase locked loop (PLL) 10 that can provide a phase-locked clock signal to N number of frequency dividers 12. The frequency dividers 12 can each control the sampling of a corresponding ADC 6. In the some examples, the PLL 10 can output a clock signal and each frequency divider 12 can divide the output of the PLL 10 by N. For instance, in situations where the output of the PLL 10 has a frequency of 1 GHz, and there are four (4) ADCs 6, each of the frequency dividers 12 could have an output with a frequency of 250 MHz at different phases. It is to be understood that in some examples, the clock signal 8 can be generated internally at the interleaved ADC 4 or external to the interleaved ADC 4 and/or the system 2. The output of each ADC 6 can be provided to an interleaver 13 that can multiplex (e.g., interleave) the outputs of the ADCs 6 to form an IADC signal.

Due to inherent fabrication and design tolerances, each individual ADC 6 has a unique gain, sampling time offset and bandwidth and other unique characteristics. Thus, a given ADC 6 has at least gain, sampling time offset and bandwidth mismatches relative to a reference ADC 6. The IADC signal includes N−1 number of spurs that are a result of the mismatches between the individual ADCs 6. Each set of mismatches relative to the reference ADC 6 can be referred to as a mismatch profile. The system 2 can correct these mismatches. Accordingly, the IADC output by the interleaved ADC 52 is referred to as an uncorrected IADC signal (labeled in FIG. 1 as "IADC (UNCORRECTED)").

The uncorrected IADC signal can be provided to a window selection randomizer 14. The window selection randomizer 14 can provide blocks of samples (e.g., of some fixed length S, such as 512 samples) from the uncorrected IADC output to the frequency domain processor 16. The window selection randomizer 14 can introduce randomness into the block-selection process. In particular, the window selection randomizer 14 can ensure that the start of each block is randomly selected so as to provide randomly selected blocks of the IADC signal.

The frequency domain processor 16 can store and process the randomly selected blocks of samples of the IADC signal. The frequency domain processor 16 can be configured to apply a windowing function and a Fast Fourier Transform (FFT) function on the randomly selected blocks. The windowing function can be implemented, for example, as the Blackman-Harris windowing function. The frequency domain processor 16 can provide frequency domain data that characterizes the FFT of the windowed blocks of the uncorrected IADC signal to a mismatch profile estimator 18. The FFT of a selected block can be referred to as an FFT block that characterizes the spectral content of the uncorrected IADC signal as a function of contiguous frequency bands referred to as FFT bins. Multiple such FFT blocks characterize the time variation of the spectral content of the uncorrected IADC signal The mismatch profile estimator 18 can apply a validity check to each of the FFT bins within an FFT block and/or across multiple FFT blocks. In particular, the validity check can perform a first validity check that compares a power of a given FFT bin to a first threshold, and rejects FFT bins that have a power below the first threshold. In this manner, the first validity check can reject low power signals and/or mismatches themselves from being processed as valid inputs for estimating the mismatch profile, thereby avoiding possible interferer generated bias. Additionally, the mismatch profile estimator 18 can perform a second validity check that compares a ratio of a power of a signal bin and a power of an image bin (signal-to-image power ratio) to a second threshold. An image bin is an FFT bin that corresponds to the location of the image of the signal, and the signal bin is an FFT bin that corresponds to the location of the signal. If the signal-to-image power ratio is below the second threshold, the corresponding image bin can be rejected. The mismatch profile estimator 18 can determine and accumulate a correlation, signal and image power, and noise variance noise variance estimate for all the non-rejected FFT bins over multiple FFT blocks.

The mismatch profile estimator 18 can calculate an instantaneous frequency domain mismatch profile estimate for each input frequency. The mismatch profile estimator 18 can also calculate an uncertainty of each instantaneous frequency domain mismatch profile estimate based on the aggregated statistics (e.g., correlation, signal and image power and noise variance estimate). Data characterizing the instantaneous frequency domain estimate and the corresponding uncertainty can be employed by the mismatch profile estimator 18 to interpolate the frequency domain mismatch profile estimate for each the ADCs 6 over a range of frequencies, including band edges. In particular, the mismatch profile estimator 18 can provide a frequency domain mismatch profile for each of the ADCs 6 in the interleaved ADC 4.

The mismatch profile estimator 18 can provide the frequency domain profiles of each filter to a close-in tone analyzer 24. Moreover, the close-in tone analyzer 24 can receive FFT bin information, such as the complex amplitude at each of the FFT bins, or some subset thereof, across multiple FFT blocks (e.g., the same bin number in multiple FFT blocks) from the frequency domain processor 16. The close-in tone analyzer 24 can also receive the uncorrected IADC signal from the interleaved ADC 4. The close-in tone analyzer 24 can process tones that have images too closely positioned by frequency to be distinguishable through FFT analysis, which tones can be referred to as close-in tones. The close-in tone analyzer 24 can estimate a power of the frequency domain profile at close-in tone bins to determine if the power is above a given threshold. Additionally, the close-in tone analyzer 24 can analyze an uncertainty of the frequency domain profiles that can be provided from the mismatch profile estimator 18 to determine the uncertainty is above another threshold. In response to determining that the estimated power of the frequency domain profile is above the given threshold and/or that uncertainty is above the other threshold, the close-in tone analyzer 24 can implement a close-in tone estimation process on the set of close-in tones.

The close-in tone estimation process can employ a time domain algorithm to estimate a correlation signal for the given tone with the image of the given tone and a power estimate for the given tone. The correlation signal and the power estimate for the given tone can be provided to the mismatch profile estimator 18. The mismatch profile estimator 18 can employ the correlation signal and the power estimate for the given tone to estimate the frequency domain mismatch profile in the manner described.

The mismatch profile estimator 18 can provide the frequency domain mismatch profiles (including those determined for close-in tones) of each of the ADCs 6 to a time domain converter 20. The time domain converter 20 can employ an Inverse Fast Fourier Transform (IFFT) to convert the mismatch profile of each of the ADCs 6 into filter coefficients in the time domain. The filter coefficients can be provided to a time domain corrector 22. The time domain corrector 22 can employ the filter coefficients in correction filters to subtract the mismatch profile for each of the ADCs 6 from the uncorrected IADC signal to produce a corrected IADC output.

Figure 2:
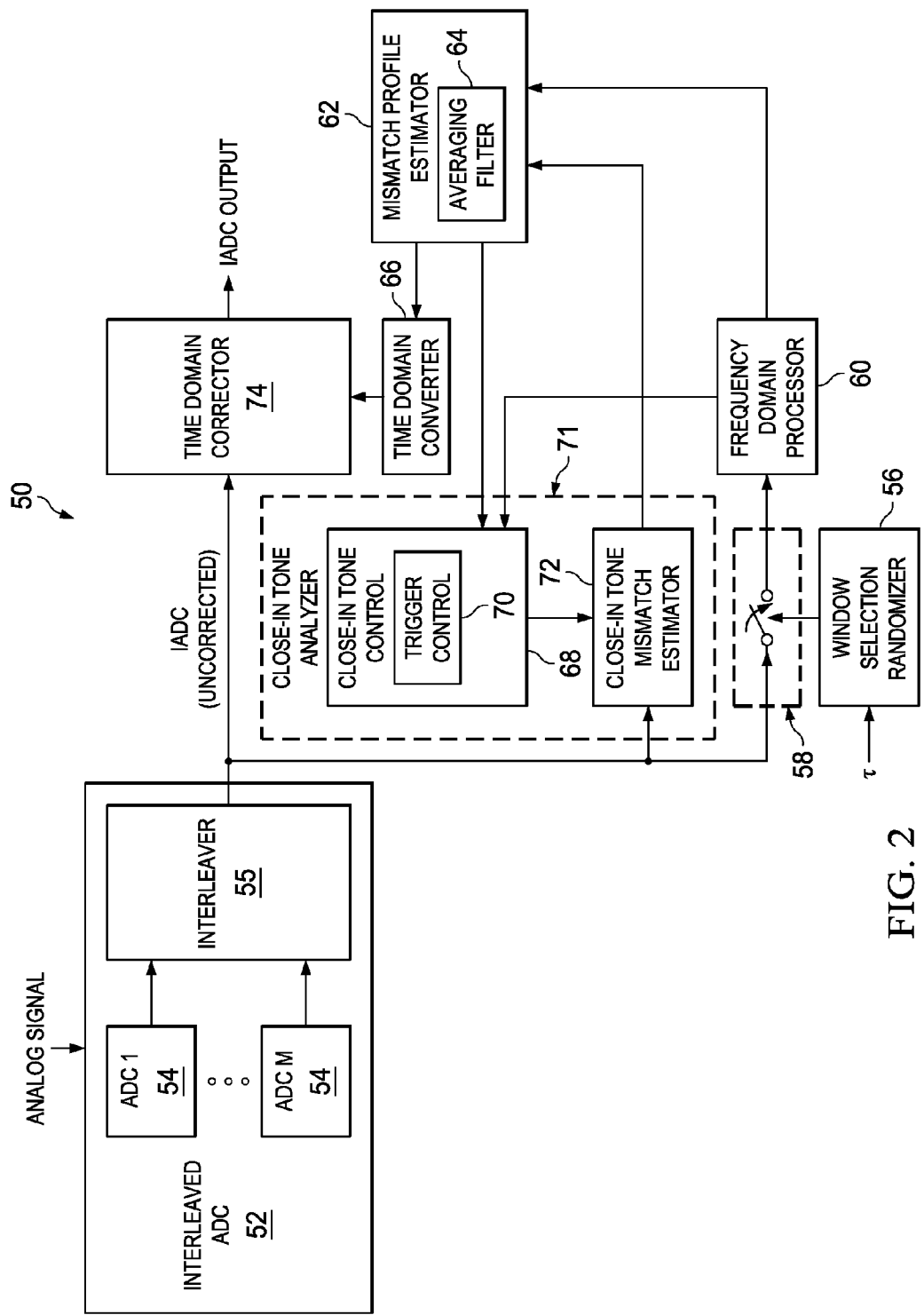
FIG. 2 illustrates another example of a system for determining a mismatch profile of an interleaved ADC.

FIG. 2 illustrates another block diagram of a system 50 for estimating mismatches in an interleaved ADC 52. The system 50 can be employed for example, to implement the system 2 illustrated in FIG. 1. The interleaved ADC 52 can include M number of parallel ADCs 54 that each sample an analog signal (labeled in FIG. 2 as "ANALOG SIGNAL"), where M is an integer greater than one. For purposes of simplification of explanation, in a simplified given example, (hereinafter, "the given example") is presumed that there are 4 ADCs 54 in interleaved ADC 52, but in other examples more or less ADCs 54 can be employed. The output from each of the 4 ADCs 54 can be multiplexed (e.g., interleaved) by an interleaver 55 and output as an uncorrected IADC signal (labeled in FIG. 2 as IADC (UNCORRECTED)). The mismatch between ADCs 54 can be due, for example, to fabrication and design tolerances, such that each individual ADC 54 has a unique gain, sampling time offset and bandwidth and/or other unique characteristics. As used herein, each mismatch represents an aggregate mismatch (or simply a "mismatch") due to each of ADC's 54 individual, gain, sampling tine, bandwidth and/or other characteristics.

Figure 3:
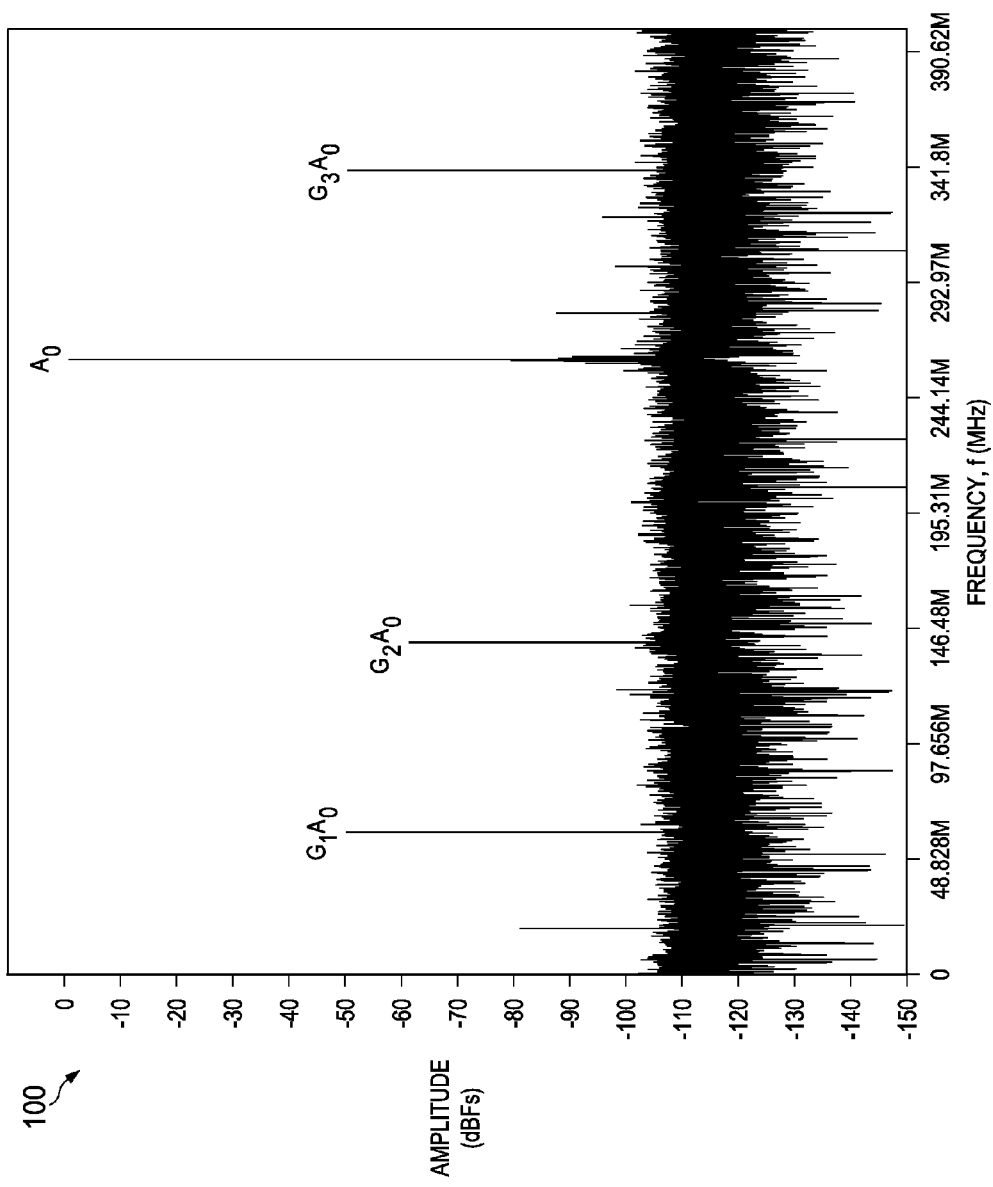
FIG. 3 illustrates an example of a graph depicting an output of an interleaved ADC without mismatch correction.

FIG. 3 illustrates an example a graph 100 of an uncorrected IADC output represented in the given example. In the graph 100, amplitude of a signal, in decibels relative to full scale (dBFS) are plotted as a function of a frequency, f, in Megahertz (MHz). As illustrated in the graph 100, in the given example, there are 3 images of the given input tone at the frequencies, $f_0+f_s/4$, $f_0+2f_s/4$ and $f_0+3*f_s/4$ with respective complex amplitudes $G_1(f_0)*A_0$, $G_2(f_0)*A_0$ and $G_3(f_0)*A_0$ for the input tone of amplitude $A_0$. Referring back to FIG. 2, Equation 1 characterizes the uncorrected IADC output in the frequency domain, whereby Y(f) can be derived.

$$Y(f) = X(f)e^{-j2\pi f\Delta} + \sum_{k1=0}^{3} X\left(f - \frac{k1 f_s}{4}\right) G_{k1}\left(f - \frac{k1 f_s}{4}\right) \quad \text{Equation 1}$$

The uncorrected IADC signal can be provided to a window selection randomizer 56. Conceptually, the window selection randomizer can be implemented as a control of a switch 58 that couples the uncorrected IADC output to a frequency domain processor 60. The window selection randomizer 56 can be configured to provide blocks of samples (of some fixed length S, such as 512 samples) of the uncorrected IADC signal to the frequency domain processor 16. The window selection randomizer 14 can introduce randomness into the block-selection process. Specifically, the window selection randomizer 14 can ensure that the start of each block is randomly selected so as to provide randomly selected blocks of the IADC signal. In particular, the starting point of each such block can be selected randomly, such that the window selection randomizer 56 can provide randomly selected blocks.

For instance, in a simplified example, exactly one block of S number of samples (e.g., 512 samples) needs to be selected for every L samples of the uncorrected IADC output, wherein L is a multiple of M that corresponds to a number of the ADCs 54. In this situation, the starting sample for the ith block is selected to be at (i−1)*L+τ, where τ is a random number with value from the set of {0, M, 2*M, . . . , (L/M−1)*M} with equal probabilities. Such a randomized block selection can facilitate reduction of the impact of a second signal (an interferer) near one of the images of a first signal on the estimation of mismatch profile at the frequency of the first signal.

The frequency domain processor 56 can store and process the randomly selected blocks. Additionally, certain blocks that violate certain conditions, such as blocks close to saturation and/or blocks with an overall power less than a threshold can be rejected by the frequency domain processor 60. In some examples, the frequency domain processor 60 can be configured to apply a windowing function and an FFT function to the non-rejected randomly selected blocks of the uncorrected IADC signal. It is noted that in some examples, the windowing function and the FFT function can be applied to all of the randomly selected blocks and the rejection of the blocks can be performed after the FFT of the randomly selected blocks is determined. The windowing size can be selected to ensure that window leakage at a frequency sufficiently removed from the signal (e.g., a tone) is about −100 dBc, thereby ensuring that the error in the estimate of the frequency domain mismatch profile, $G_k(f)$ is less than about −80dBc. In one example, the windowing function can be implemented, for example, as the Blackman-Harris windowing function with a window length of about 512 samples. In other examples, different window sizes can be employed.

Figure 4:
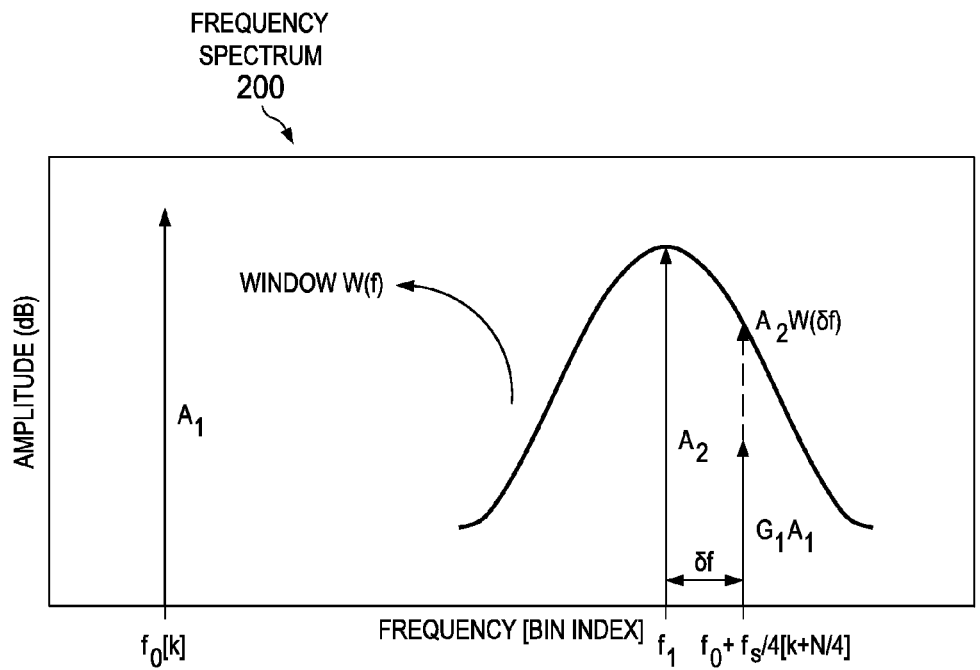
FIG. 4 illustrates an example of a diagram that depicts the amplitude of tones and images of tones as a function of Fast Fourier Transform (FFT) bin index.

The windowing function can cause interference due to an independent signal in an image band. FIG. 4 illustrates this concept. In particular, FIG. 4 depicts a graph 200 plots an amplitude of a two-tone example (hereinafter, "the two-tone example) with a first tone $A_1$ and a second tone, $A_2$ as a function of frequency (bin index). In the two-tone example, the window leakage (e.g., window attenuation) due to the windowing function, $W(f)$ can introduce an error in the calculation of the signal-image correlation. For each block of data, the error corresponds to a complex tone with a frequency of δf at a block start instant. Stated differently, as illustrated in the graph 200, in the two-tone example, leakage at the second tone, $A_2W(δf)$ on the location of the image of the first tone, $G_1A_1$, thereby introducing correlation errors. For instance, in the two tone example, the error in the correlation (without randomization of block selection), $Er^i$ for FFT block number i can be calculated with Equation 2.

$$\sum_i Er^i = A_1 A_2 W(δf) \sum_i e^{-j2πiLδf} \quad \text{Equation 2}$$

wherein:

$$j = \sqrt{-1}$$

(throughout this disclosure);

$$δf = \frac{i}{LT_s};$$

L is the period of block selection specified in number of samples of the uncorrected IADC signals; and $$T_s = \frac{1}{f_s}.$$

From Equation 2, in situations where blocks are selected every $LT_s$ seconds, correlation errors for $$δf = \frac{i}{LT_s}$$

Figure 5:
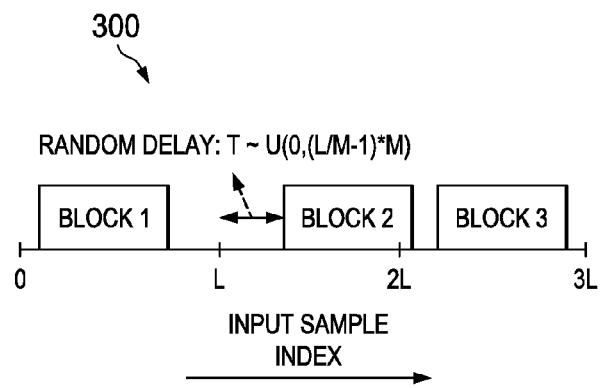
FIG. 5 illustrates a conceptual example of a randomized block selection.

(i is a positive integer), will be in phase and add up upon aggregation, which can introduce bias of estimates for $G_k(f)$. Referring back to FIG. 2, as noted, the window selection randomizer 56 provides randomly selected blocks to the frequency domain processor 60 based on a random number, τ. FIG. 5 illustrates a conceptual example of a randomized block selection 300. In FIG. 5, the frequency domain processor 60 selects blocks at time periods of L. As is illustrated in FIG. 5, the window selection randomizer 56 can randomly select a starting point for each block based on the random number, τ, wherein τ is a random number with value from the set of {0, M, 2*M, . . . , (L/M−1)*M} with equal probabilities. Moreover, some of the randomly selected blocks may be overlapping. However, such overlapping blocks of data do not introduce biases for the estimations of $G_k(f)$.

Referring back to FIG. 2, such a randomized delay can ensure that the error term, the complex tone at δf, is uniformly sampled about a unit circle for of $δf=i/LT_s$. In this manner, correlation errors introduced by the interferer for every block of data are not in-phase (e.g., for δf>0). Accordingly, the interferer appears "noise-like" (e.g., a mean of '0') after aggregation.

Figure 6:
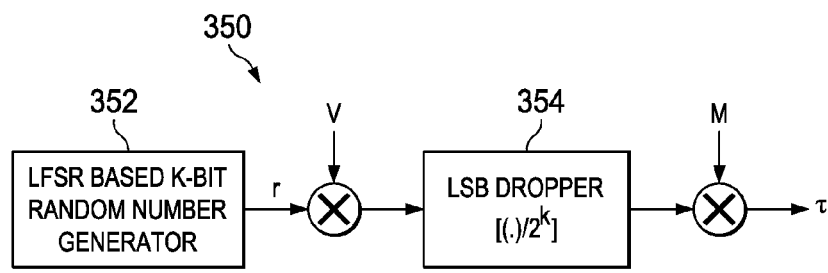
FIG. 6 illustrates a block diagram of an example of a random number generator.

FIG. 6 illustrates a block diagram of an example of a random number generator 350 that can provide τ to the window selection randomizer 56 illustrated in FIG. 2. The random number generator 350 can include a linear feedback shift register (LFSR) based K-bit random number generator 352. The value of K is selected such that, $2^K$ is much greater than L/M. That is, $2^K$>>L/M. The LFSR based K-bit random number generator 352 can output a random number r that can be mixed with an arbitrary value of V. The mixed output can be processed by a least significant bit (LSB) dropper 354. The LSB dropper 354 can divide the mixed output function by $2^K$ to remove K number of the LSBs and provide an output of $K/2^K$ that can be multiplied by M to generate τ that can be employed as the random number explained with respect to FIGS. 2 and 8. The random number generator 350 can be employed to ensure that the output of τ is distributed substantially uniformly about the set of {0, M, 2*M, . . . , (L/M−1) *M}. It is to be understood that in other examples, other methods could be employed for generating the random number.

Referring back to FIG. 2, the frequency domain processor 60 can provide frequency domain data that characterizes the FFT of the selected blocks of the uncorrected IADC signal to a mismatch profile estimator 62. The mismatch profile estimator 62 can be employed to implement the mismatch profile estimator 18 of FIG. 1. The mismatch profile estimator 62 can determine a correlation between tones, $C_k(f)$ for each of the FFT bins. The correlation between two tones, $C_k(f)$ can be characterized by Equation 3.

$$C_k(f) = G_k(f)|Y(f)|^2 + G_{4-k}^*\left(f + \frac{kf_s}{4}\right)\left|Y\left(f + \frac{kf_s}{4}\right)\right|^2 + n'(f) \quad \text{Equation 3}$$

In the given example, by employing Equation 3, the mismatch profile estimator 62 can correlate the conjugate of the given input tone ($A_0^*$) with the appropriate image ($G_k A_0$) to derive Equation 4.

$$C_k(f_0) = G_k(f_0)|A_0|^2 \quad \text{Equation 4}$$

The mismatch profile estimator 62 can measure $C_k(f_0)$ at the FFT bins. Additionally, the mismatch profile estimator 62 can estimate a power, in decibels to full scale (dBFS) for each FFT bin and perform a first validity check to determine if the power of each tone is above a threshold. The mismatch profile estimator 62 can also perform a second validity check to determine if a signal-to-image power ratio (e.g., a ratio of signal power to image power) is greater than a threshold (e.g., second threshold) to limit estimation errors due to interferer generated bias. Tones that fail the first or second validity checks can be rejected.

The non-rejected tones, namely tones that passed the first and second validity checks are aggregated, as well as correlations, signal and image power and noise variance estimates are accumulated for the selected FFT bins across multiple FFT blocks. The mismatch profile estimator 62 can aggregate correlation values (when the values pass the first and second validity checks) for a predetermined (e.g., preprogrammed) number of the FFT blocks.

The sum of correlation and the sum of signal and image power for the selected blocks can be stored by the mismatch profile estimator 62 as aggregated statistics, for example in a non-transitory machine readable medium (e.g., a memory). In some examples, the aggregated statistics can be stored as a data structure (e.g., a linked list). Moreover, the mismatch profile estimator 62 can estimate unknown mismatch profiles, $G_k(m)$ for the non-rejected (valid) tones. The mismatch profile estimator 62 can also determine an aggregate power of both contributors (a tone, and an image of the tone).

The aggregate power of both contributors can be stored by the mismatch profile estimator 62 in the aggregate statistics. Furthermore, the mismatch profile estimator 62 can determine an aggregate noise present in the FFT bins. The mismatch profile estimator 62 can determine an aggregate noise presence based on the aggregate noise in each of the FFT bins. Moreover, the mismatch profile estimator 62 can determine a noise variance, $R^k(m)$ based on the aggregated noise. The noise variance, $R^k(m)$ can also be stored in the aggregated statistics by the mismatch profile estimator 62.

The mismatch profile estimator 62 can employ the correlation values stored in the aggregate statistics to calculate (e.g., estimate) an instantaneous frequency domain mismatch profile estimate, $G_k(f_0)$ for each input signal. In the given example, since $C_k(f_0)$ and $|A_0|^2$ is known (via the aggregated statistics), $G_k(f_0)$ (including $G_1(f_0)$, $G_2(f_0)$ and $G_3(f_0)$) can be determined/estimated.

Data characterizing the instantaneous frequency domain mismatch profile estimate, $G_k(f)$ can be processed by an averaging filter 64 of the mismatch profile estimator 62. The averaging filter 64 can include, for example, a Kalman filter, an infinite input response (IIR) filter or the like. The averaging filter 64 can store historical data characterizing past instantaneous frequency domain mismatch profile estimates, $G_k(m)$ for different frequencies. The averaging filter 64 can determine an estimate of the frequency domain mismatch profile $G_k(m)$, recursively.

The estimate of the frequency domain mismatch profile, $G_k(m)$ can be provided from the averaging filter 64 to a time domain converter 66. The time domain converter 66 can modify an estimate for $G_k(m)$ at the $0^{th}$ bin and a last bin, namely a bin at $f_s/2$ (e.g., $128^{th}$ bin for 256-point FFT) to reflect the fact that $h_i$ (a correction filter, as explained herein) is a real filter. Once $h_i$ is a real filter, $G_2(0)$ and $G_2(128)$ are real, $G_3(0) = G_1^*(0)$ and $G_3(128) = G_1^*(128)$. These conditions can be imposed on the $G_k(m)$ estimates. The remaining tones can be linearly interpolated and extrapolated to generate an estimate of $G_k(m)$ for frequencies across a band of interest to generate an estimate for a continuous frequency domain mismatch profile, $G_k(f)$. Additionally, in some examples, smoothing can be implemented with shaping filters for regions outside the band of interest to predetermined boundary conditions. The prior $G_k(f)$ estimates (e.g., from the averaging filter 64) can be provided to a close-in tone control 68 of a close-in tone analyzer 71. Additionally, the frequency domain processor 60 can provide the FFT bins to the close-in tone control 68. The close-in tone control 68 can analyze the aggregated statistics to identify an FFT output corresponding to a close-in tone bin. The close-in tone control 68 can also monitor the prior $G_k(f)$ estimates to detect prior $G_k(f)$ estimates that are near close-in tones.

Figure 7:
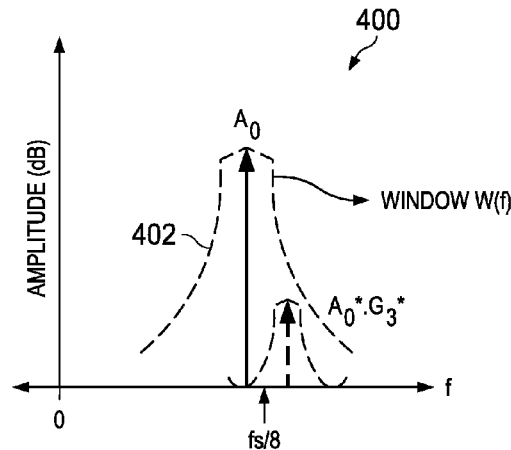
FIG. 7 illustrates a graph that illustrates close-in tones.

FIG. 7 illustrates a graph 400 that illustrates close-in tones. The graph 400 plots an amplitude of a signal (in dB) as a function of frequency. A tone labeled '$A_0$' has a correlated image labeled $A_0^*G_3^*$. In the graph 400, a dashed line 402 represents the window leakage due to the windowing function $W(f)$. As is illustrated, the correlated image $A_0^*G_3^*$ falls "too close" (in frequency) to the tone $A_0$ to distinguish the correlated image $A_0^*G_3^*$ from the tone $A_0$ using FFT analysis due to the window leakage indicated by the dashed line 402. Thus, these tones can be referred to as "close-in tones". It is noted that in the graph 400 the tone $A_0$ is close to $f_s/8$.

Referring back to FIG. 2, for an input tone close to $kf_s/2M$, (including $f_s/8$, $f_s/4$ and $3f_s/8$, when there are 4 ADCs 54, such that M is equal to 4) an image of the of the input tone (an image band) can fall close to the input tone, thereby forming a set of close-in tones, where k is an integer selected from the set of $\{1, 2, \ldots, M-1\}$. The close-in tone control 68 can include a trigger control 70 that can provide a close-in trigger to a close-in tone mismatch estimator 72 of the close-in tone analyzer 71. The close-in tone control 68 can parse the FFT bins to identify each close-in tone bin (an FFT bin corresponding to close-in tone inputs) and provide FFT data at each close-in tone bin to the trigger control. Additionally, the close-in tone control 68 can parse the prior estimates of the mismatch profiles, $G_k(f)$ to identify each prior $G_k(f)$ estimate that is near close-in tones. As used herein, the prior $G_k(f)$ estimates that are "near close-in tones" can be the prior $G_k(f)$ estimates in a set of FFT bins adjacent to the close-in tones.

Figure 8:
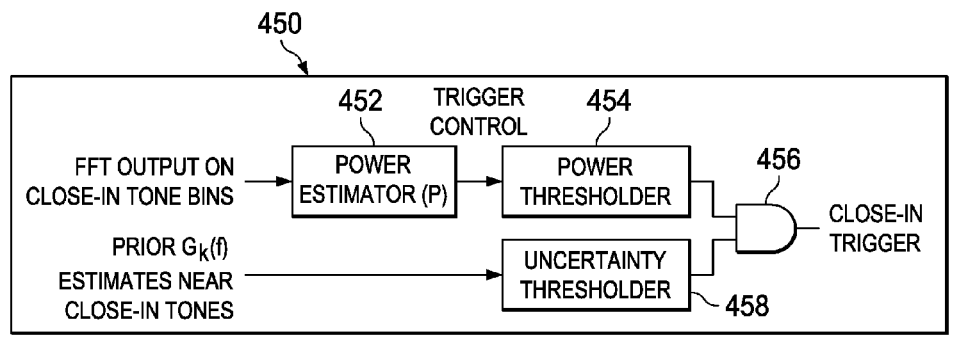
FIG. 8 illustrates a block diagram of a trigger control.

FIG. 8 illustrates a block diagram of an example of a trigger control 450 that could be employed to implement the trigger control 70 of FIG. 2. The trigger control 450 can include a power estimator 452 that can determine a power (P) of each detected close-in tone bin. Additionally, the trigger control 450 can include a power thresholder 454 that can determine if the power of a given close-in tone bin is greater than a power threshold. Conceptually, the power thresholder 454 can determine whether the close-in tone bin includes a real set of close-in tones, and not simply noise. If the power of the given close-in tone bin is greater than the power threshold, the power thresholder 454 can provide an 'ON' signal (e.g., a logic '1') to an AND gate 456 of the trigger control 450. In contrast, if the power of the given close-in tone bin is less than the power threshold, the power thresholder 454 can provide an 'OFF' signal (e.g., a logic '0') to the AND gate 456 of the trigger control 450.

Additionally, the trigger control 450 can include an uncertainty thresholder 458 that can determine if an uncertainty of prior $G_k(f)$ estimates near close-in tones is greater than an uncertainty threshold. The uncertainty threshold can indicate whether the uncertainty of the prior $G_k(f)$ is small enough to employ as the profile mismatch estimate for the close-in tone set, such that a new profile mismatch estimate need not be calculated. If the uncertainty of the prior $G_k(f)$ estimates are greater than the uncertainty threshold (e.g., uncertainty too large), the uncertainty thresholder 458 can provide an "ON" (e.g., logic '1') signal to the AND gate 456. Conversely, if the uncertainty of the prior $G_k(f)$ estimates are less than the uncertainty threshold (e.g., uncertainty sufficiently small), the uncertainty thresholder 458 can provide an "OFF" (e.g., logic '0') signal to the AND gate 456. The output of the AND gate 456 can correspond to a close-in trigger that can be provided to the close-in tone mismatch estimator 72 illustrated in FIG. 2.

The close-in tone mismatch estimator 72 can receive the uncorrected IADC signal. The close-in tone mismatch estimator 72 can be configured to estimate data that can be employed to estimate mismatches that occur around close-in tones in response to receiving a close-in trigger from the trigger control 70. Such data can include a correlation and a power estimate for the close-in tones. Specifically, the close-in tone mismatch estimator 72 can provide a close-in correlation estimate, $z_i(n)$ and a power estimate, $z_2(n)$ can be calculated by the close-in tone mismatch estimator 72 in response to a trigger signal. The operations of the close-in tone mismatch estimator 72 can be completed in the time domain, thereby obviating the problems associated with FFT analysis (e.g., window leakage) of close-in tones.

Figure 9:
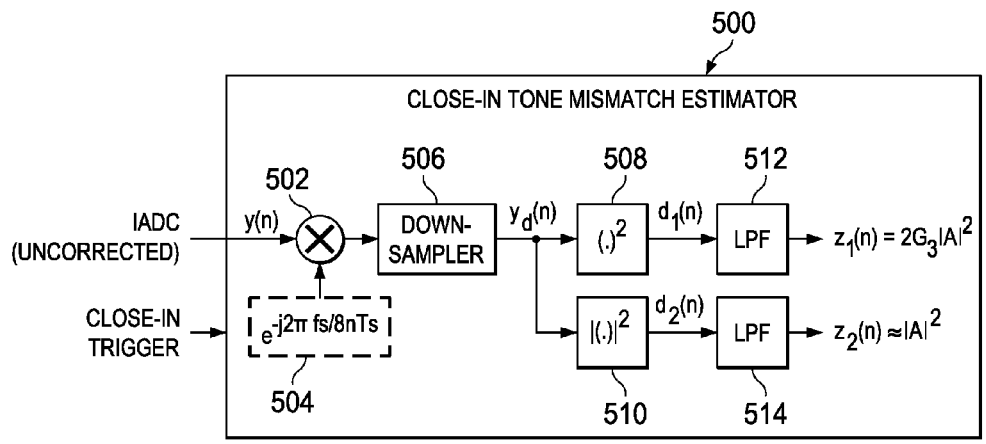
FIG. 9 illustrates a block diagram of a close-in tone mismatch estimator.
Figure 13:
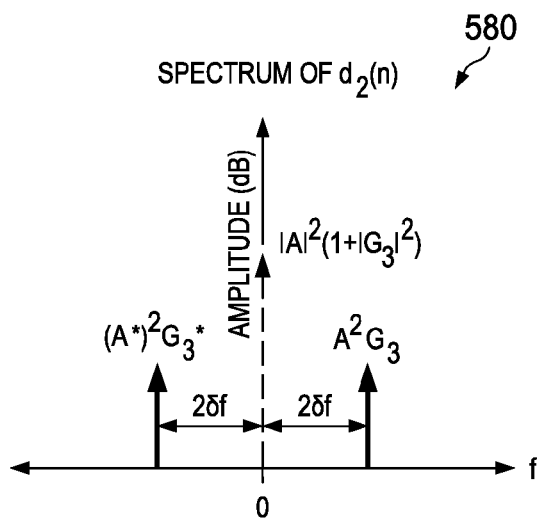

FIG. 9 illustrates a block diagram of a close-in tone mismatch estimator 500 that could be employed to implement the close-in tone mismatch estimator 72 of FIG. 2. The close-in tone mismatch estimator 500 can receive the close-in trigger (e.g., provided by the trigger control 450) and the uncorrected IADC signal (labeled in FIG. 9 as "IADC (UNCORRECTED)". An uncorrected IADC signal can be represented as y(n). The close-in tone mismatch estimator 500 can include a mixer 502 that can mix the ideal IADC signal with a complex exponential sequence 504. In the example illustrated in FIG. 9, the complex exponential sequence 504 is $e^{-j2\pi f_s/8nT_s}$, which corresponds to a frequency shift of $f_s/8$ of the uncorrected IADC signal. However, in other examples, such as a close-in tone being detected at $f_s/4$ or $3f_s/8$, a different complex exponential sequence 504 could be employed.

The output of the mixer 502 can be provided to a downsampler 506. The downsampler 506 can apply anti-alias filtering and then reduce the sampling rate of the signal output by the mixer 502, which process can also be referred to as decimation. In some examples, the sampling rate can be reduced by about ⅟32. Thus, for an uncorrected IADC signal with a sampling rate of about 1 GHz, the downsampler 506 can output a signal with a downsampled rate of about 32 MHz. The output of the downsampler 506, $y_d(n)$ which corresponds to a frequency shifted, downsampled signal, can be provided to a squarer 508 and a power estimator 510. The squarer 508 can calculate a square of $y_d(n)$ in the time domain (denoted in FIG. 9 as "(.)²"), $d_1(n)$. The power estimator 510 can calculate a magnitude of the square (denoted in FIG. 9 as "|(.)|²" of $y_d(n)$, which can correspond to an approximate power, $d_2(n)$. The output of the squarer 508 and the power estimator 510 can be provided to low pass filters (LPFs) 512 and 514. The LPFs 512 and 514 can have a cutoff frequency sufficient to remove unwanted higher frequency terms. As illustrated in FIG. 9, the output of the LPF 512 can be a correlation estimate, $z_1(n)=2G_3|A|^2$, for a tone 'A'. Moreover, as illustrated in FIG. 9, the output of the LPF 514 can be a power estimate, $z_2(n) \approx |A|^2$ for the tone 'A'.

FIGS. 10-13 depict graphs 550, 560, 570 and 580 that illustrate the operations of the close-in tone mismatch estimator 500. The graphs 550, 560, 570 and 580 plot an amplitude (in dB) of a signal as a function of frequency. Moreover, the graphs 550, 560, 570 and 580 employ the same identifiers to denote the same signals and variables. In the example illustrated in FIGS. 10-13, an input tone 'A' is near $f_s/8$ and thus forms a set of close in tones with an image with a complex amplitude of 'A*$G_3$' In particular, in the graph 550, illustrates an example of a spectrum of y(n) (e.g., input into the mixer 502). In the graph 550, the input tone 'A' and the image 'A*$G_3$' are each separated from $f_s/8$ by an equal (or nearly equal) amount, δf. In the graph 560, the spectrum of $y_d(n)$ (output by the downsampler 506) is plotted. As is illustrated, the spectrum has been frequency shifted (relative to y(n)) such that the input tone 'A' and the image 'A*$G_3$' are separated from the origin ('0') by δf.

The graph 570 depicts a spectrum of $d_1(n)$ (the output of the squarer 508). As is illustrated, in the graph 570, a DC signal (frequency of '0') with a magnitude of '$2G_3|A|^2$' can be calculated by the squarer 508. Similarly, graph 580 depicts a spectrum of $d_2(n)$ (the output of the power estimator 510). As is illustrated in the graph 580, a DC signal with a magnitude of $|A|^2(1+|G_3|^2)$ (which is approximately equal to $|A|^2$) can be calculated. It is noted that the non-DC signals of graphs 570 and 580 can be removed by the LPFs 512 and 514, respectively to calculate $z_1(n)$ and $z_2(n)$.

Referring back to FIG. 2, the mismatch profile estimate for $G_3$ can be calculated using simple algebra from the outputs $z_1(n)$ and $z_2(n)$. Thus, the outputs for the correlation estimate, $z_1(n)$ and the power estimate $z_1(n)$ of the close-in tones can be provided to the averaging filter 64 such that $G_k(f)$ can be derived and tracked for the close-in tones of the uncorrected IADC signal.

The time domain converter 66 can employ an IFFT to the convert continuous frequency domain mismatch profile, $G_k(f)$ into a complex discrete time domain filter function, $g_k(m)$. Each of the complex filter functions $g_k(m)$ may correspond to complex filters (e.g., filters with coefficients that may or may not be complex numbers).

The time domain converter 66 can convert the time domain filter functions $g_k(m)$ into filter coefficients $h_i(m)$ by employing Equation 5. Each of the filter coefficients, $h_i(m)$ can correspond to real filters (e.g., filters that have real number coefficients). As noted, since $h_0(m)=0$, indicating that there is no correction applied to the output of the reference ADC 54, and thus, $h_0(m)$ does not need to be implemented. Accordingly, there are less filter coefficients $h_i(m)$ that are implemented than the number of $g_k(m)$ filters functions.

$$h_i(m) = \sum_{k=0}^{M-1} g_k(m) e^{\frac{j2\pi i k}{M}}, \qquad \text{Equation 5}$$

for all m

Wherein:

i runs from 1 to M−1;

$h_0(m)=0$.

The filter coefficients, $h_i(m)$ can be provided to time domain corrector 74 that can receive the uncorrected IADC signal from the interleaved ADC 52. The time domain corrector 74 can employ the filter coefficients, $h_i(m)$ in correction filters to remove the spurs caused by the interleaving of the M number of ADCs 54 and output a corrected IADC output (labeled in FIG. 2 as "IADC (CORRECTED)").

By employing the system 50, an estimation of a mismatch profile between the M number of ADCs 54 can be achieved. Additionally, the mismatch profile between the M number of ADCs 54 can be estimated in situations where a tone is close-in (in terms of frequency) with an image of the tone.

Figure 14:
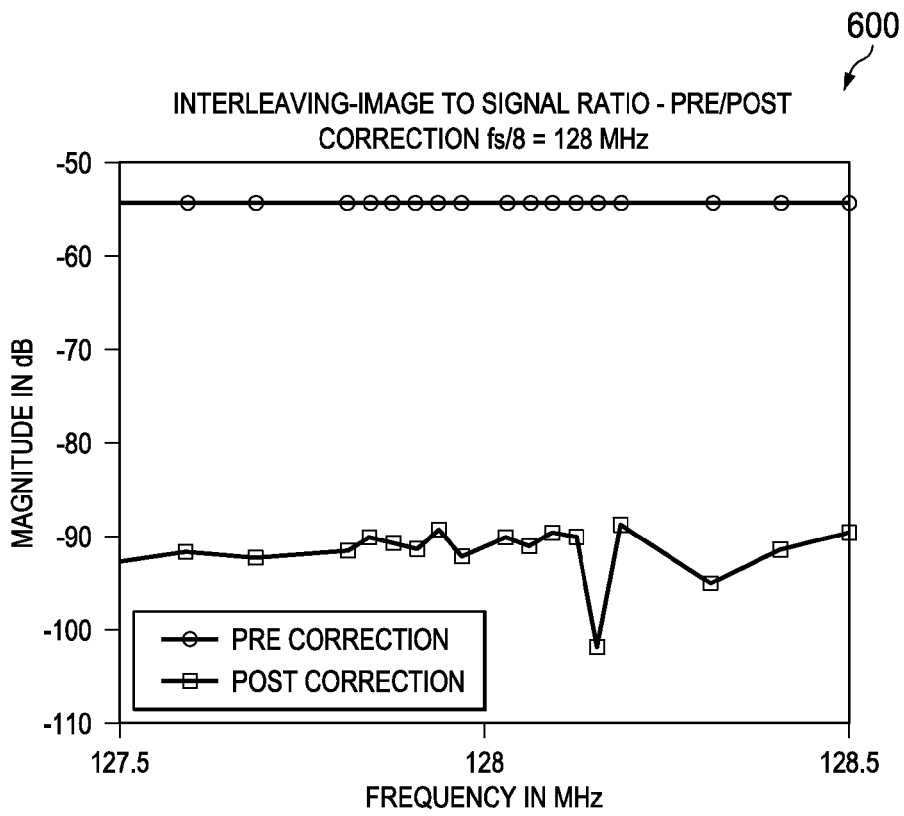
FIG. 14 illustrates an example of a graph depicting interleaving image levels in corrected IADC outputs represented for close-in tones near $f_s/8$.

FIG. 14 illustrates an example of a graph 600 depicting a corrected IADC outputs represented for close-in signals near $f_s/8$. The graph 600 plots a magnitude (in dB) of an interleaving-image to signal ratio as a function of frequency (in MHz) before and after the correction of the IADC signal described with respect to FIGS. 1 and 2. As is illustrated in the graph 600, the interleaving image to signal ratio has improved by at least about −45 dB.

Figure 15:
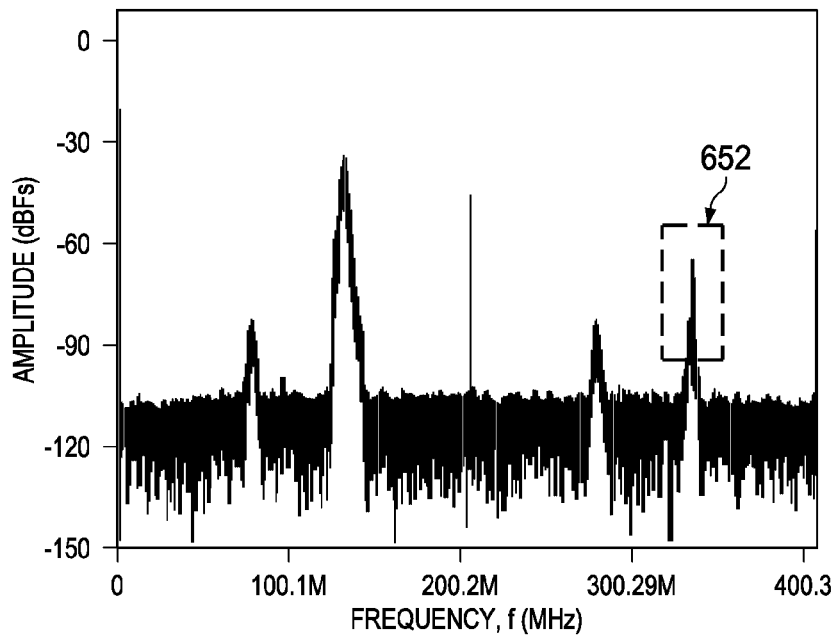
FIG. 15 illustrates an example of a graph depicting an uncorrected IADC signal.
Figure 16:
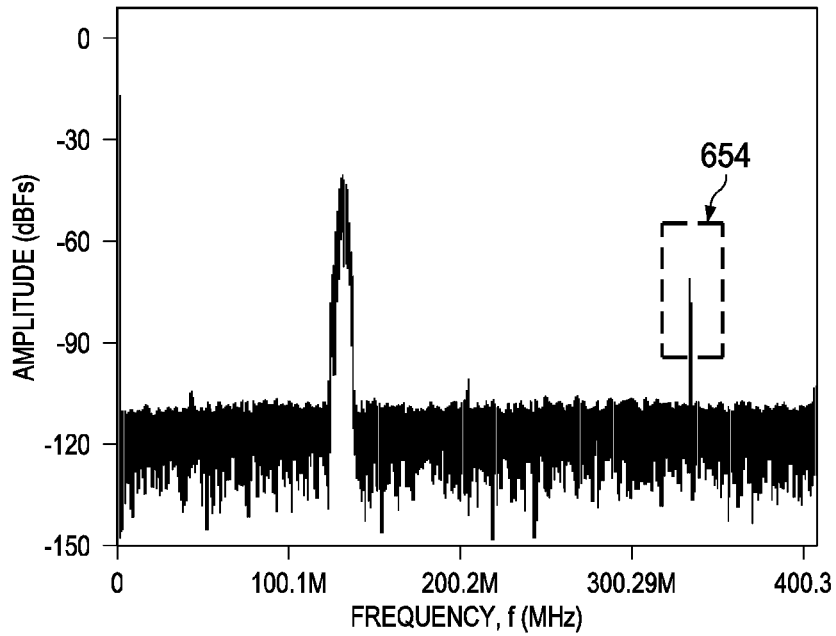
FIG. 16 illustrates an example of a graph depicting the IADC signal illustrated in FIG. 15 after correction has been applied.

FIG. 15 illustrates an example of a graph 650 depicting an uncorrected IADC signal represented. FIG. 16 illustrates an example of a graph 670 depicting the IADC signal illustrated in FIG. 15 after correction has been applied. In the graphs 650 and 670 amplitude of a signal, in dBc is plotted as a function of an input frequency in MHz. In the graph 650 an independent tone is input close to an image of a wideband signal, thereby providing a strong interference to mismatch estimation over the frequencies occupied by the wideband signal. As illustrated in the graph 670 at block 654, the impact of the interfering signal is reduced due to the introduction of the randomly selected blocks.

Figure 17:
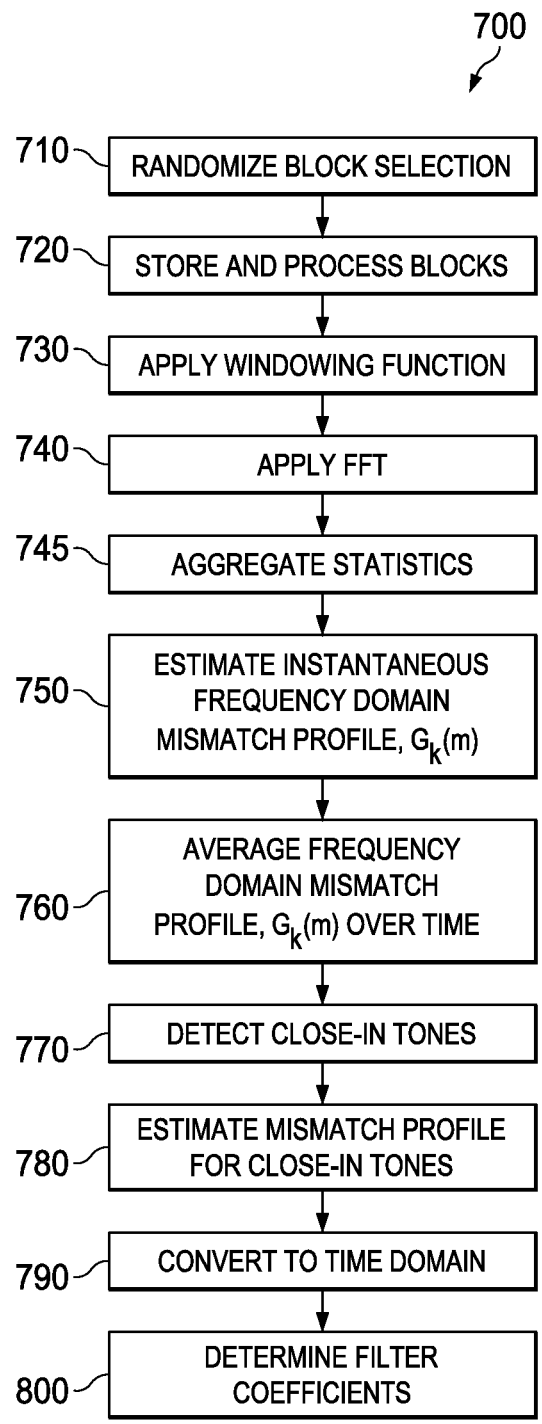
FIG. 17 illustrates an example of a method for preventing the impact of an interferer on mismatch profile estimation and detecting and processing close-in tones.

In view of the foregoing structural and functional features described above, an example method will be better appreciated with reference to FIG. 17. While, for purposes of simplicity of explanation, the example method of FIG. 17 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 17 can be implemented as instructions stored in an IC chip (e.g., as firmware) that are executable by a processor (e.g., a microcontroller) and/or as logic (e.g., an FPGA).

FIG. 17 illustrates an example of a method 700 for preventing an impact of independent interferers on mismatch profile estimation. Additionally or alternatively, the method 700 can be employed for detecting and processing close-in tones. It is noted that in some examples, the method of preventing the impact of independent interferers in mismatch profile estimation and the method of method of detecting and processing close-in tones can be employed independently. However, in the method 700, the actions for the preventing the impact of interferers on the mismatch profile estimation, and the detecting and processing the close-in tones are described in combination. The method 700 could be implemented, for example by the system 2 of FIG. 1 and/or the system 50 of FIG. 2. At 710, a window selection randomizer (e.g., the window selection randomizer 14 of FIG. 1) can randomize a block selection to provide randomly selected blocks of input samples of the IADC signal. At 720, a frequency domain processor (e.g., the frequency domain processor 16 of FIG. 1) can store and process the randomly selected blocks of input samples. At 730, the frequency domain processor can apply a windowing function to the randomly selected blocks of input samples. At 740, the frequency domain processor can apply an FFT to convert the windowed and randomly selected blocks into the frequency domain.

At 745, a mismatch profile estimator (e.g., (e.g., the mismatch profile estimator 18 of FIG. 1) can aggregate statistics for all (or a subset) of the FFT bins over multiple FFT blocks to generate aggregated statistics. At 750, the mismatch profile estimator can estimate an instantaneous frequency domain mismatch profile, $G_k(m)$ based on the aggregated statistics. At 760, the mismatch profile estimator can average the frequency domain mismatch profile, $G_k(m)$ over time. Moreover, in some situations, the averaging over time can be performed across multiple FFT blocks.

At 770, a close-in tone analyzer (e.g., the close-in tone analyzer 24 of FIG. 1) can detect set of close-in tones, wherein a tone falls close to (in terms of frequency) an image of the tone. At 780, the close-in tone analyzer can employ time domain analysis to estimate the correlation and the power of the close-in tones. The estimate for the correlation and the power of the close-in tones can be provided back to the mismatch profile estimator.

At 790, a time domain converter (e.g., the time domain converter 20 of FIG. 1) can convert the frequency domain mismatch profile, $G_k(m)$ to the time domain to form a time domain mismatch profile, $g_k(m)$. At 800, the time domain converter can determine filter coefficients, $h_i(m)$ based on the time domain mismatch profile, $g_k(m)$. The filter coefficients can be employed to correct the IADC signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
   a close-in tone control configured to:
   detect a set of close-in tones of an interleaved analog to digital converter (IADC) signal; and
   output a trigger signal in response to the detection; and
   a close-in tone mismatch estimator determines a correlation and a power estimate for the set of close-in tones in the IADC signal in response to the trigger signal.

2. The system of claim 1, wherein the set of close-in tones comprises:
   a tone with a frequency near a particular fraction of the sampling frequency ($f_s$) of the IADC signal; and
   an image of the tone with a frequency near the frequency of the tone.

3. The system of claim 2, wherein the tone has a frequency near any frequency defined by $kf_s/2M$, wherein k is a positive integer less than M, and M defines a number of component analog-to-digital converters (ADCs) in an interleaved ADC that provides the IADC signal.

4. The system of claim 2, wherein the close-in tone mismatch estimator comprises a mixer to mix the IADC signal with a frequency shift word to generate a frequency shifted signal.

5. The system of claim 4, wherein the close-in tone mismatch estimator further comprises a downsampler to reduce the sampling frequency of the IADC signal.

6. The system of claim 5, wherein the close-in tone mismatch estimator further comprises a squarer that determines a square of the IADC signal for the close-in tones in the time domain.

7. The system of claim 5, wherein the close-in tone mismatch estimator further comprises a power estimator that determines a power estimate of the close-in tones in the time domain.

8. The system of claim 7, wherein an output of the squarer is provided to a low pass filter that removes high frequency signals.

9. The system of claim 1, further comprising:
an interleaved analog-to-digital converter (ADC) comprising component ADCs, the interleaved ADC outputs the IADC signal, wherein the IADC signal comprises spurious signals generated from mismatches in the component ADCs.

10. The system of claim 1, further comprising a window selection randomizer that randomizes selection of blocks of the IADC signal based on a random number.

11. The system of claim 10, wherein the random numbers are substantially uniformly distributed over a predetermined set of numbers.

12. The system of claim 10, further comprising a frequency domain processor data selector configured to:
receive the randomly selected blocks of the IADC signal;
apply a windowing function to the randomly selected blocks of the IADC signal to provide windowed blocks of data; and
convert the windowed blocks of data into the frequency domain to provide a frequency domain representation of the IADC signal.

13. The system of claim 1 further comprising a profile mismatch estimator determines an estimate of a frequency domain mismatch profile based in part on the correlation and the power estimate for the set of close-in tones in the IADC.

14. The system of claim 1, wherein the close-in tone control receives data from a mismatch profile estimator characterizing an estimate of a mismatch profile for tones near in frequency to the set of close-in tones, wherein the trigger signal is prevented from being output in response to determining that the estimate of the mismatch profile for the tones near in frequency to the set of close-in tones has an uncertainty below an uncertainty threshold.

15. The system of claim 1, wherein the close-in tone control prevents the trigger signal from being output in response to determining a Fast Fourier Transform (FFT) bin corresponding to the set of close-in tones has a power below a power threshold.

16. An integrated circuit (IC) chip comprising:
an analog-to-digital converter (ADC) interleaver comprising a plurality of ADCs that are each configured to sample an analog signal in response to a clock pulse, wherein the Interleaved ADC outputs an interleaved ADC (IADC) signal that comprises a plurality of spurs formed from mismatches between the plurality of ADCs;
a frequency domain processor determines a frequency domain representation of the interleaved IADC signal;
a close-in tone control configured to:
detect a set of close-in tones of the IADC signal based on the frequency domain representation of the IADC signal;
receive data from a mismatch profile estimator characterizing an estimate of a mismatch profile for a tone near in frequency the set of close-in tones; and
output a trigger signal in response to detecting that a Fast Fourier Transform (FFT) bin corresponding to the set of close-in tones has a power above a power threshold and in response to determining that the estimate of the mismatch profile for the tones near in frequency the set of close-in tones has an uncertainty above an uncertainty threshold; and
a close-in tone mismatch estimator determines a correlation and a power estimate for the set of close-in tones in the IADC signal in response to the trigger signal.

17. The IC chip of claim 16, wherein the close-in tone mismatch estimator determines a square of the IADC signal for the set of close-in tones and a power estimate for the set of close-in tones.

18. The IC chip of claim 16, further comprising a window selection randomizer that randomizes selection of blocks of the IADC signal.

19. A method comprising:
randomizing selection of blocks of samples an interleaved analog-to-digital (IADC) signal to provide randomly selected blocks;
applying a windowing function to the randomly selected blocks of samples of the IADC signal;
applying a Fast Fourier Transform (FFT) to the selected blocks of samples to determine a frequency domain representation of the IADC signal; and
estimating a frequency domain mismatch for the interleaved ADC signal.

20. The method of claim 19, further comprising determining a correlation and a power estimate of a set of close-in tones of the interleaved ADC signal.

* * * * *